US008595561B1

(12) United States Patent
Lu et al.

(10) Patent No.: US 8,595,561 B1
(45) Date of Patent: Nov. 26, 2013

(54) INTEGRATED DEBUGGING WITHIN AN INTEGRATED CIRCUIT HAVING AN EMBEDDED PROCESSOR

(75) Inventors: Ting Lu, Austin, TX (US); Robert L. Pelt, San Jose, CA (US); Bradley L. Taylor, Santa Cruz, CA (US)

(73) Assignee: Xilinx, Inc., San Jose, CA (US)

( * ) Notice: Subject to any disclaimer, the term of this patent is extended or adjusted under 35 U.S.C. 154(b) by 376 days.

(21) Appl. No.: 12/913,713

(22) Filed: Oct. 27, 2010

(51) Int. Cl.
*G06F 11/00* (2006.01)

(52) U.S. Cl.
USPC .............................................. 714/45; 714/25

(58) Field of Classification Search
USPC ....................................... 714/25, 45
See application file for complete search history.

(56) References Cited

U.S. PATENT DOCUMENTS

| 5,581,482 | A | 12/1996 | Wiedenman et al. |
| 5,835,702 | A | 11/1998 | Levine et al. |
| 5,867,644 | A | 2/1999 | Ranson et al. |
| 6,351,724 | B1 | 2/2002 | Klassen et al. |
| 7,308,564 | B1 | 12/2007 | Jenkins, IV |
| 7,913,123 | B2 * | 3/2011 | Al-Omari et al. ............ 714/45 |
| 7,979,750 | B2 * | 7/2011 | Al-Omari et al. ............ 714/45 |
| 8,327,200 | B1 * | 12/2012 | Mohan ........................ 714/725 |
| 2003/0110430 | A1 * | 6/2003 | Bailis et al. ................. 714/725 |
| 2003/0163298 | A1 | 8/2003 | Odom et al. |
| 2007/0168749 | A1 * | 7/2007 | Stewart et al. ............... 714/39 |
| 2008/0239082 | A1 | 10/2008 | Zhu et al. |
| 2009/0007076 | A1 * | 1/2009 | Al-Omari et al. ........... 717/128 |

OTHER PUBLICATIONS

Taylor, Brad and Wittig, Ralph, "28nm Generation Programmable Families", 7 Series FPGAs, Extensible Processing Platform Family, AMBA AX14 IP, Aug. 8, 2010, pp. 1-25, Xilinx, 2100 Logic Drive, San Jose, CA 95124.
Nass, Rich, "Xilinx puts ARM Core into its FPGAs", EE Times, 2 pp., Apr. 27, 2010, available at http://www.eetimes.com/electronics-products/processors/4115523/Xilinx-puts-ARM-core-into-its-FPGA.
U.S. Appl. No. 13/005,941, Taylor, Bradley, L., et al., filed Jan. 13, 2011, Xilinx, Inc., 2100 Logic Drive, San Jose, CA 95124 USA.
U.S. Appl. No. 13/005,962, Taylor, Bradley, L., et al., filed Jan. 13, 2011, Xilinx, Inc., 2100 Logic Drive, San Jose, CA 95124 USA.
U.S. Appl. No. 13/005,994, Taylor, Bradley, L., et al., filed Jan. 13, 2011, Xilinx, Inc., 2100 Logic Drive, San Jose, CA 95124 USA.

* cited by examiner

*Primary Examiner* — Charles Ehne
(74) *Attorney, Agent, or Firm* — Kevin T. Cuenot

(57) ABSTRACT

A method of debugging within an integrated circuit (IC) that includes an embedded processor can include detecting an event within a circuit of the IC that is external to the processor and, responsive to detecting the event, initiating a debug function within the processor. Similarly, responsive to detecting an event within the processor, a debug function within a circuit block of the IC that is external to the processor can be initiated. Trace data generated within the processor and trace data generated within the programmable fabric further can be merged to generate combined trace data.

16 Claims, 6 Drawing Sheets

INTEGRATED DEBUGGING WITHIN AN INTEGRATED CIRCUIT HAVING AN EMBEDDED PROCESSOR

FIELD OF THE INVENTION

One or more embodiments disclosed within this specification relate to integrated circuits (ICs). More particularly, one or more embodiments relate to debugging within an IC that includes an embedded processor.

BACKGROUND

Integrated circuits (ICs) can be implemented to perform a variety of functions. One type of IC is a programmable IC such as, e.g., a field programmable gate array (FPGA). An FPGA typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable circuit elements that can include, for example, function generators, registers, arithmetic logic, and so forth.

The programmable interconnect circuitry and programmable logic circuitry are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA. Accordingly, the loading of first configuration data specifying a first circuit design into the programmable IC results in implementation of first physical circuitry within the programmable IC. The loading of second configuration data specifying a second circuit design that is different from the first circuit design results in implementation of second physical circuitry within the programmable IC that is different from the first physical circuitry.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality and physical circuitry that is implemented within the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

Some modern ICs, including programmable ICs, can include embedded processors that are capable of executing program code. For example, some models of the Virtex 5 type of programmable IC available from Xilinx Inc. of San Jose, Calif., can include a PowerPC® 440 type of processor. The processor is fabricated as part of the same die that includes the programmable logic circuitry and the programmable interconnect circuitry, also referred to as the programmable fabric. Despite the incorporation of a processor, the systems available for testing and debugging the processor and the circuits implemented within the programmable fabric are separate and independent systems. For example, the system available to debug the processor exists as a separate and independent entity from the system available to debug the circuit design implemented within the programmable fabric of the IC.

SUMMARY

One or more embodiments disclosed within this specification relate to integrated circuits (ICs) and, more particularly, to debugging within an IC that includes an embedded processor.

An embodiment can include a method of debugging within an IC that includes an embedded processor. The method can include detecting an event within a circuit of the IC that is external to the processor and, responsive to detecting the event, initiating a debug function within the processor.

Another embodiment can include a method of debugging within an IC having an embedded processor. The method can include detecting an event within the processor and, responsive to detecting the event, initiating a debug function within a circuit block of the IC that is external to the processor.

Another embodiment can include an IC that includes programmable fabric that is configurable to implement different physical circuits. The IC can include a processor embedded within the IC and an interface coupling the programmable fabric with the processor. The interface can be configured for cross-triggering of debug functions between the processor and the programmable fabric.

DETAILED DESCRIPTION OF THE DRAWINGS

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to integrated circuits (ICs) and, more particularly, to debugging within an IC that includes an embedded processor. An IC can be implemented to include an embedded processor coupled to a programmable fabric portion. Within the IC, the programmable fabric can be coupled to the embedded processor to facilitate integrated debugging functionality. For example, debugging functions available within the processor can be integrated with debugging functions available within the programmable fabric of the IC.

In general, integrated debugging facilitates the ability to cross trigger debugging functions between the processor and the programmable fabric. For example, a debugging function within the processor can be initiated from the programmable fabric. In another example, a debugging function within the programmable fabric can be initiated from the processor. Integrated debugging also allows trace data generated by the processor and trace data generated by the programmable fabric to be merged to provide a more cohesive, comprehensive, and unified set of trace data for system analysis.

Figure 1:
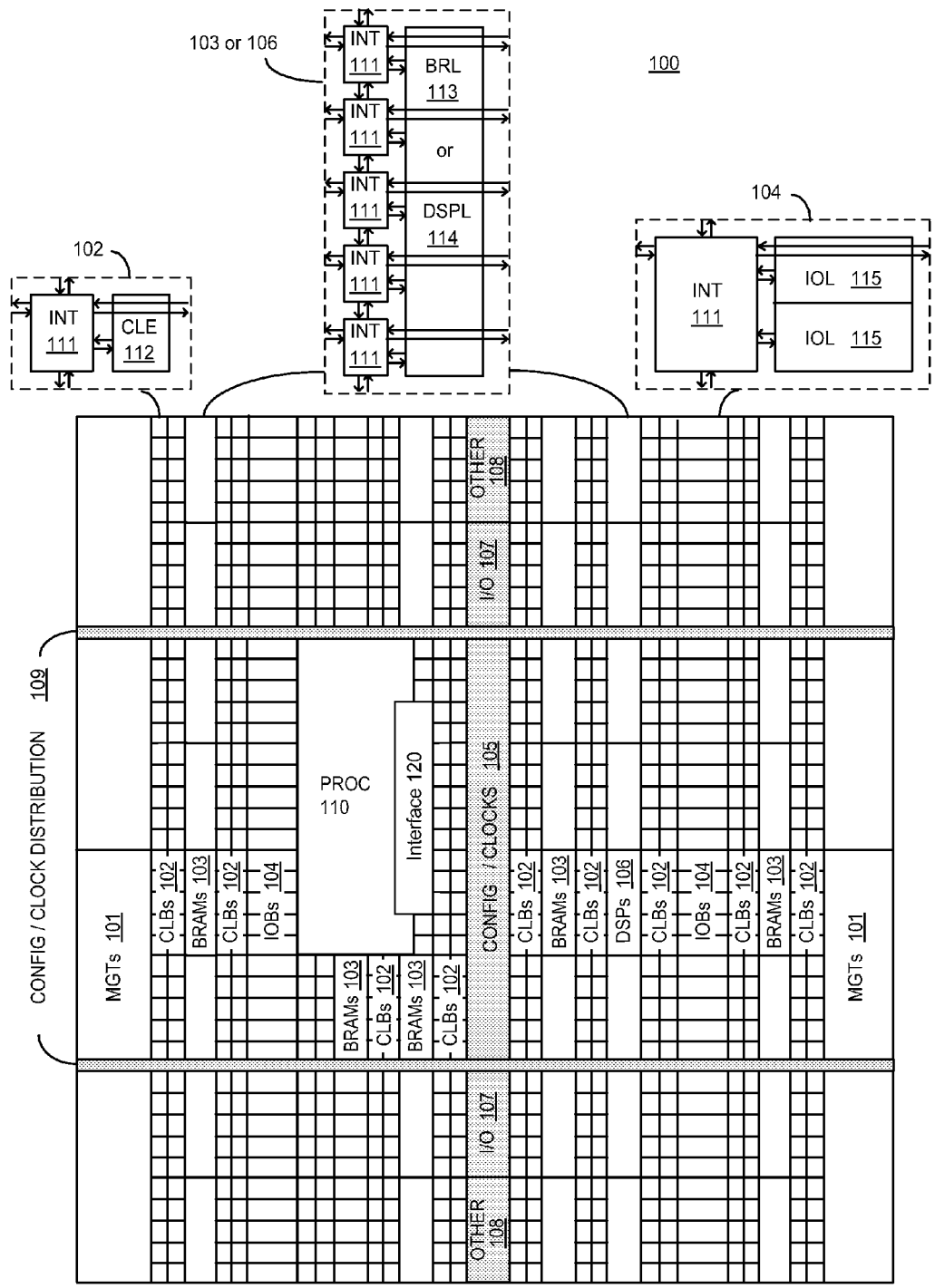
FIG. 1 is a first block diagram illustrating an architecture 100 for an integrated circuit (IC) in accordance with an embodiment disclosed within this specification.

FIG. 1 is a first block diagram illustrating an architecture 100 for an IC in accordance with an embodiment disclosed within this specification. Architecture 100 can be implemented within a field programmable gate array (FPGA) type of IC, for example. As shown, architecture 100 includes several different types of programmable circuits, e.g., logic, blocks. For example, architecture 100 can include a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., configuration ports and clock ports), and other programmable logic 108 such as digital clock managers, analog-to-digital converters, system monitoring logic, and so forth. As noted, some programmable ICs, e.g., FPGAs, also include dedicated processor blocks such as PROC 110.

In some programmable ICs, each programmable tile includes a programmable interconnect element (INT) 111 having standardized connections to and from a corresponding interconnect element in each adjacent tile. Therefore, the programmable interconnect elements taken together implement the programmable interconnect structure for the illustrated IC. The programmable interconnect element (INT) 111 also includes the connections to and from the programmable logic element within the same tile, as shown by the examples included at the top of FIG. 1.

For example, a CLB 102 can include a configurable logic element (CLE) 112 that can be programmed to implement user logic plus a single programmable interconnect element (INT) 111. A BRAM 103 can include a BRAM logic element (BRL) 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL) 114 in addition to an appropriate number of programmable interconnect elements. An IOB 104 can include, for example, two instances of an input/output logic element (IOL) 115 in addition to one instance of the programmable interconnect element (INT) 111. As will be clear to those of skill in the art, the actual I/O pads connected, for example, to the I/O logic element 115 typically are not confined to the area of the input/output logic element 115.

In the example pictured in FIG. 1, a columnar area near the center of the die (shown shaded in FIG. 1) is used for configuration, clock, and other control logic. Horizontal areas 109 extending from this column are used to distribute the clocks and configuration signals across the breadth of the programmable IC.

Some programmable ICs utilizing the architecture illustrated in FIG. 1 include additional logic blocks that disrupt the regular columnar structure making up a large part of the programmable IC. The additional logic blocks can be programmable blocks and/or dedicated circuitry. For example, the processor block PROC 110 shown in FIG. 1 spans several columns of CLBs and BRAMs.

FIG. 1 is intended to illustrate only an exemplary architecture that can be used to implement a programmable IC. For example, the number of logic blocks in a column, the relative width of the columns, the number and order of columns, the types of logic blocks included in the columns, the relative sizes of the logic blocks, and the interconnect/logic implementations included at the top of FIG. 1 are purely exemplary. In an actual programmable IC, for example, more than one adjacent column of CLBs is typically included wherever the CLBs appear, to facilitate the efficient implementation of user logic. The number of adjacent CLB columns, however, can vary with the overall size of the programmable IC.

As noted, the processor embedded within architecture 100, depicted as PROC 110, can be a hard processor that is fabricated as part of the die that implements the programmable IC. In another embodiment, PROC 110 can represent an entire processor system. As such, PROC 110 can include one or more cores, e.g., central processing units, cache memories, a memory controller, unidirectional and/or bidirectional interfaces configurable to couple directly to I/O pins of the programmable IC and/or couple to the programmable fabric of the programmable IC. The phrase "programmable fabric" can refer to programmable circuitry within an IC, e.g., the various programmable or configurable circuit blocks described herein, as well as the interconnect circuitry that selectively couples the various circuit blocks and programmable tiles and/or elements according to configuration data that is loaded into the IC.

As shown, architecture 100 can include an interface 120. Interface 120, like PROC 110, can be implemented as a hard circuit block. Interface 120 can include one or more unidirectional and/or bi-directional communication links, e.g., buses, that couple PROC 110 with the programmable fabric of the IC. The communication links implemented within interface 120 can be used to send debug information such as debugging commands and/or trace information from PROC 110 to the programmable fabric and from the programmable fabric to PROC 110.

Figure 2:
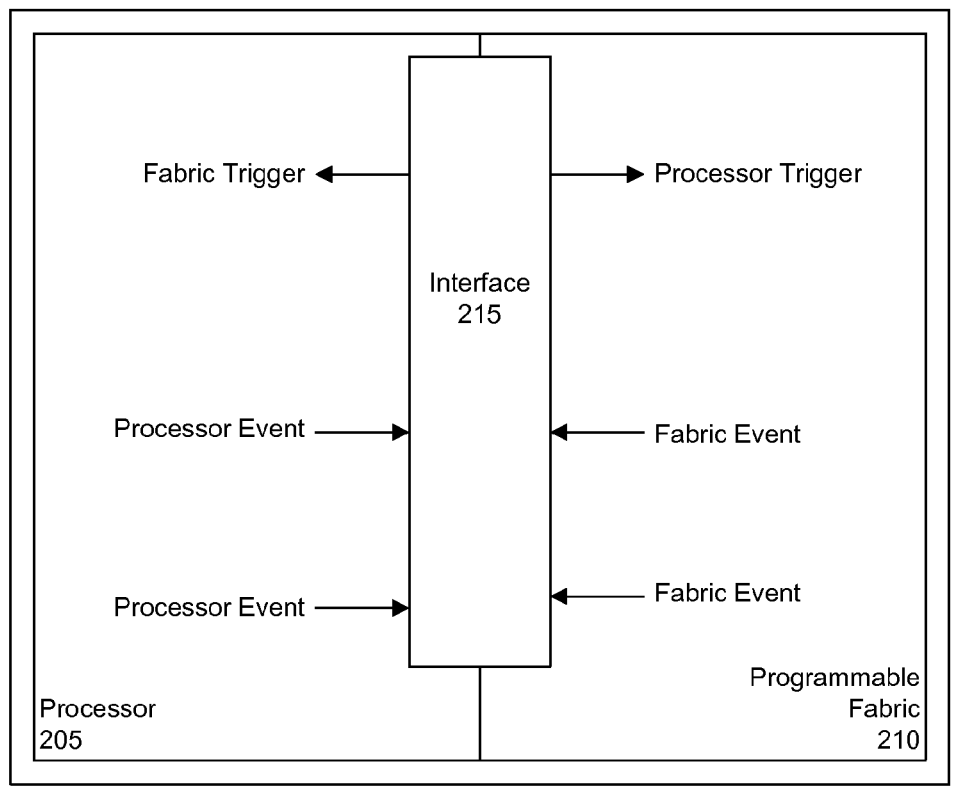
FIG. 2 is a second block diagram illustrating an IC configured for integrated debugging in accordance with another embodiment disclosed within this specification.

FIG. 2 is a second block diagram illustrating an IC 200 configured for integrated debugging in accordance with another embodiment disclosed within this specification. IC 200 can be implemented using any of a variety of different architectures that include an embedded processor coupled to a programmable fabric. For example, IC 200 can be implemented using architecture 100 of FIG. 1, though this need not be the case.

FIG. 2 illustrates a simplified view of IC 200, which includes a processor 205 and a programmable fabric 210 coupled by an interface 215. Processor 205 can be implemented upon the same die as programmable fabric 210. As noted with reference to FIG. 1, processor 205 can represent an entire processor system that is implemented as a hard circuit. As pictured in FIG. 2, processor 205 can be external to programmable fabric 210 and, as such, any circuit blocks implemented within programmable fabric 210. Similarly, programmable fabric 210, inclusive of any circuit blocks implemented within programmable fabric 210, can be said to be external to processor 205.

Programmable fabric 210 can be implemented to include one or more programmable circuit blocks that can be coupled together using programmable interconnect circuitry. The programmable circuit blocks and the programmable interconnect circuitry can be configured to implement one or more different physical circuits, e.g., user circuit designs, based upon configuration data loaded into IC 200. For example, based upon the configuration data that is loaded into IC 200, different physical circuits can be implemented or formed within programmable fabric 210.

Interface 215 can be implemented substantially as described with reference to FIG. 1. For example, interface 215 can include one or more unidirectional and/or bidirectional communication links implemented as hard circuits. Accordingly, one or more circuit blocks within processor 205 can be connected to interface 215. Similarly, one or more circuit blocks implemented as soft intellectual property (IP) cores within programmable fabric 210 can be connected to interface 215. In an embodiment disclosed herein, interface 215 can be implemented in the form of a crossbar switch. Interface 215, for example, can include logic circuitry that can evaluate received signals illustrated as processor events from processor 205 and fabric events from programmable fabric 210.

The phrase "fabric event" can refer to a one or more signals generated within programmable fabric 210 and provided to interface 215. A fabric event, for example, also can be a function of one or more other signals within programmable fabric 210 that, when evaluated, causes another signal to be generated or take on a particular value. Similarly, the phrase "processor event" can refer to one or more signals or values that can be provided to interface 215 from processor 205. Examples of such signals or values can include, but are not limited to, values stored in particular registers of processor 205, interrupts generated by processor 205, or the like. An "event" can refer to a fabric event, a processor event, or both.

A "fabric trigger" refers to a signal or command that is generated responsive to a condition, e.g., an event, within programmable fabric 210 that initiates a debug function within processor 205. A "processor trigger" refers to a signal or command that is generated responsive to an event within processor 205 that initiates a debug function within programmable fabric 210. In this regard, interface 215 facilitates cross-triggering of debug functions within IC 200.

For example, interface 215 can be configured to generate a fabric trigger to initiate a debug function within processor 205 responsive to one or more fabric events. The debug function within processor 205 can be initiated without involvement of processor 205, e.g., only responsive to the fabric trigger. Similarly, interface 215 can be configured to generate a processor trigger to initiate a debug function within programmable fabric 210 responsive to one or more processor events. The debug function within programmable fabric 210 can be initiated without involvement of programmable fabric 210, e.g., only responsive to the processor trigger.

In another embodiment disclosed herein, interface 215 can be configured to receive processor trace data from processor 205 and fabric trace data from programmable fabric 210. Interface 215 can be configured to merge the processor trace data with the fabric trace data to generate combined trace data that can be stored within either processor 205, programmable fabric 210, or output to a destination external to IC 200. For example, the debug function initiated within processor 205 and/or programmable fabric 210 can be the generation of trace data.

Figure 3:
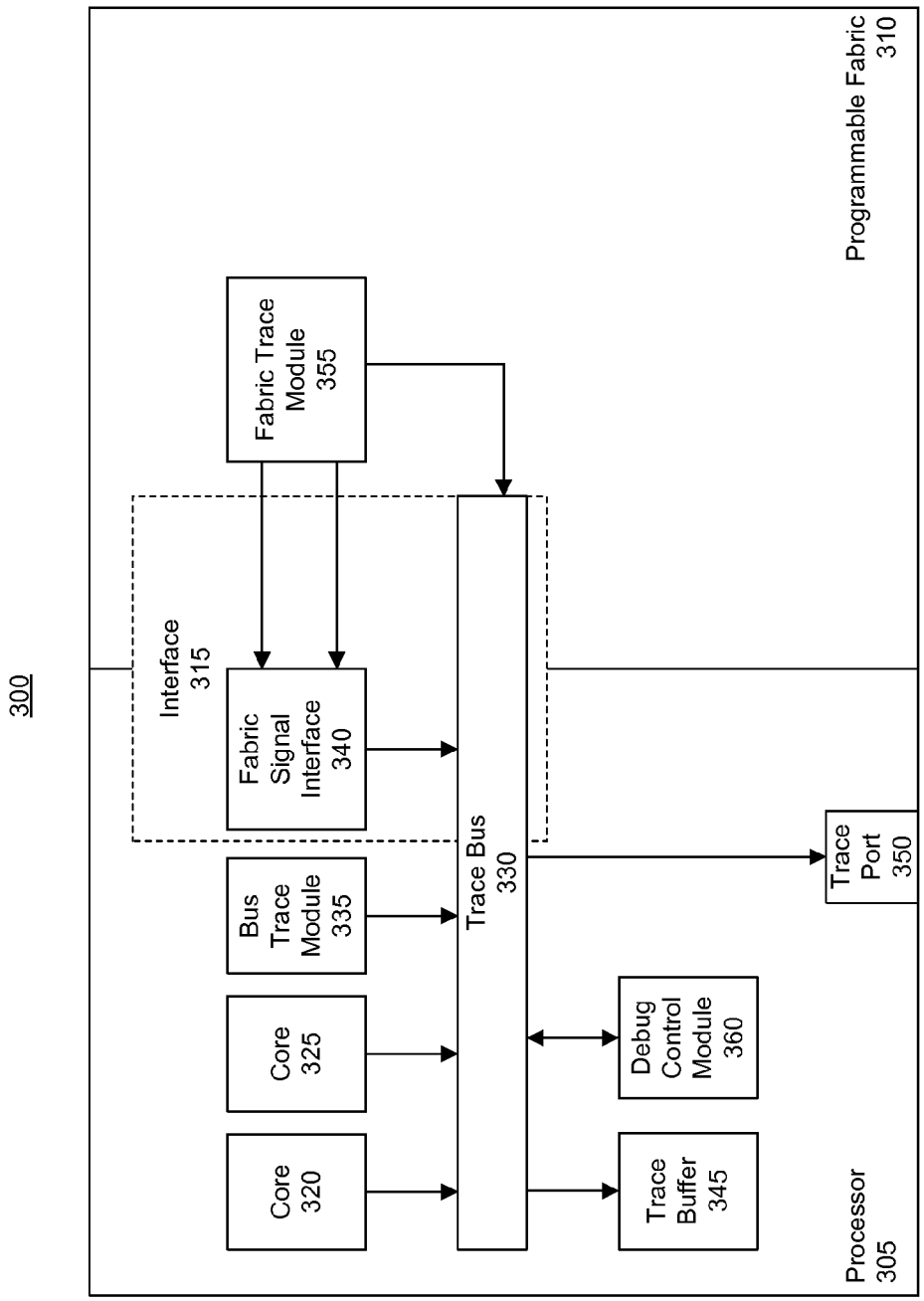
FIG. 3 is a third block diagram illustrating an IC configured for integrated debugging in accordance with another embodiment disclosed within this specification.

FIG. 3 is a third block diagram illustrating an IC 300 configured for integrated debugging in accordance with another embodiment disclosed within this specification. FIG. 3 illustrates a more detailed view of the processor embedded within the IC and the connectivity available between the processor and the programmable fabric of the IC. As shown, IC 300 can include a processor 305 coupled to programmable fabric 310 via an interface 315.

Processor 305 can include a core 320, a core 325, a trace bus 330, a bus trace module 335, a trace buffer 345, a trace port 350, and a debug control module 360. Interface 315 can include a fabric signal interface 340. As shown, trace bus 330, or at least a portion thereof, can be considered part of interface 315. In another embodiment, trace bus 330, trace buffer 345, bus trace module 335, debug control module 360, and optionally fabric signal interface 340 can be considered part of a debug system of processor 305.

As noted, processor 305 and interface 315 can be implemented as hard circuits. By comparison, fabric trace module 355 can be implemented in the form of a soft IP core. Fabric trace module 355 can receive one or more signals, e.g., probed signals, from a user circuit design physically implemented within programmable fabric 310. It should be appreciated that such signals can be provided to interface 315 directly as illustrated within FIG. 2, for example, or can be provided to interface 315 through fabric trace module 355. In any case, the user circuit and fabric trace module 355 are physically implemented within programmable fabric 310 in consequence of loading configuration data specifying the circuit structures into IC 300.

Trace bus 330 can be configured to carry trace data including processor trace data, fabric trace data, or both. The phrase "trace data," as used herein, can include one or more signal and/or register values that can be collected from circuit modules and provided to a destination, e.g., a debugging system, for evaluation or storage. The phrase "processor trace data" can refer to trace data that is generated by any circuit block within processor 305. For example, trace data generated or captured by core 320, core 325, or bus trace module 335 can be considered processor trace data. The phrase "fabric trace data" can refer to trace data that originates, or is generated from within, programmable fabric 310.

Cores 320 and 325 can execute programmatic instructions. Each of cores 320 and 325 can be coupled to trace bus 330 within processor 305. Core 320 and core 325 each can output processor trace data, e.g., particular register values, to trace bus 330 responsive to a debug command. Bus trace module 335 can be coupled to trace bus 330. Bus trace module 335 can capture data that is sent or transported over the processor data bus (not shown) of processor 305. Data captured by bus trace module 335 from the processor data bus can be sent or placed on trace bus 330. Accordingly, processor trace data captured by bus trace module 335 can include any data that is being distributed among the various components within processor 305 that communicate over the processor data bus. Bus trace module 335 can place processor trace data on trace bus 330 responsive to a debug command.

Fabric signal interface 340 can be configured to receive one or more signals directly from circuitry implemented within programmable fabric 310. In an embodiment disclosed herein, circuitry within programmable fabric 310 can be implemented to provide one or more signals directly to fabric signal interface 340 bypassing fabric trace module 355. In another embodiment, fabric trace data can be routed through fabric trace module 355 to fabric signal interface 340. The signals received by fabric signal interface 340 can include fabric events as described with reference to FIG. 1, and/or fabric trace data.

As shown, fabric signal interface 340 can place fabric trace data received from programmable fabric 310 onto trace bus 330. In another embodiment, fabric trace module 355 can be coupled to trace bus 330. In that case, fabric trace module 355 can place fabric trace data directly onto trace bus 330.

Trace buffer 345 can be implemented as a physical memory configured to store trace data within processor 305. Trace buffer 345 is coupled to trace bus 330 and, as such, can store any trace data that is placed on trace bus 330. Trace port 350 also can be coupled to trace bus 330. Accordingly, any trace data that is placed on trace bus 330 can be output from IC 300 via trace port 350.

As described with reference to FIG. 2, the interface between the processor and the programmable fabric can trigger debug functions responsive to received events. In another embodiment, other circuit blocks can be configured to initiate debug commands, e.g., sent triggers. For example, fabric trace module 355 can be configured to generate a fabric debug command that is sent to processor 305 to initiate a debug function within processor 305 responsive to detecting one or more fabric events. Similarly, one or more of core 320, core 325, bus trace module 335, and/or debug control module 360 can generate processor debug commands responsive to detecting a processor event. The processor debug command can be provided to fabric trace module 355 via trace bus 330, for example, to initiate a debug function within programmable fabric 310, i.e., within fabric trace module 355.

In an embodiment disclosed herein, fabric debug commands can be provided from interface 315 or fabric trace module 355 to one or more circuit blocks, e.g., core 320, core 325, or bus trace module 335, directly. In another embodiment, fabric debug commands can be provided from interface 315 or fabric trace module 355 to debug control module 360. Debug control module 360 can then, in response to the fabric debug command, send debug commands to one or more or all of the various circuit blocks within processor 305 to initiate a debug function within such circuit blocks.

In an embodiment disclosed within this specification, trace data generated within programmable fabric 310 and provided to processor 305, whether via fabric signal interface 340 or directly onto trace bus 330, can be commingled with the processor trace data. For example, fabric trace data that is placed onto trace bus 330 can be time stamped according to the time clock maintained within processor 305. The fabric trace data can be combined and/or merged with the processor trace data. The resulting combined trace data can be stored within trace buffer 345 or output via trace port 350.

For example, each portion of trace data placed on trace bus 330 can be time stamped according to a clock source within processor 305. Because trace bus 330 can receive both processor and fabric trace data in the form of bus transactions, the processor and fabric trace data can be commingled, e.g., mixed, on bus 330. Accordingly, trace data can be stored or transmitted in order according to increasing time stamps of the transactions, thereby resulting in commingling of processor and fabric trace data within the same trace buffer or as output from trace port 350. It should be appreciated that by merging processor trace data with fabric trace data, events occurring within the processor and/or the programmable fabric are effectively correlated with one another between the two different domains.

In another embodiment, fabric trace data can be stored within trace buffer 345 or output from trace port 350 independently of any processor trace data. For example, fabric trace module 355 can output fabric trace data, whether via fabric signal interface 340 or directly onto trace bus 330. Other components, e.g., core 320, core 325, and/or bus trace module 335, can be configured not to output trace data. Accordingly, only fabric trace data is stored within trace buffer 345 or output from IC 300 via trace port 350. In either case, IC 300 allows circuitry within programmable fabric to take advantage of debugging functions that are typically built into processor systems, but unavailable in the conventional case.

Figure 4:
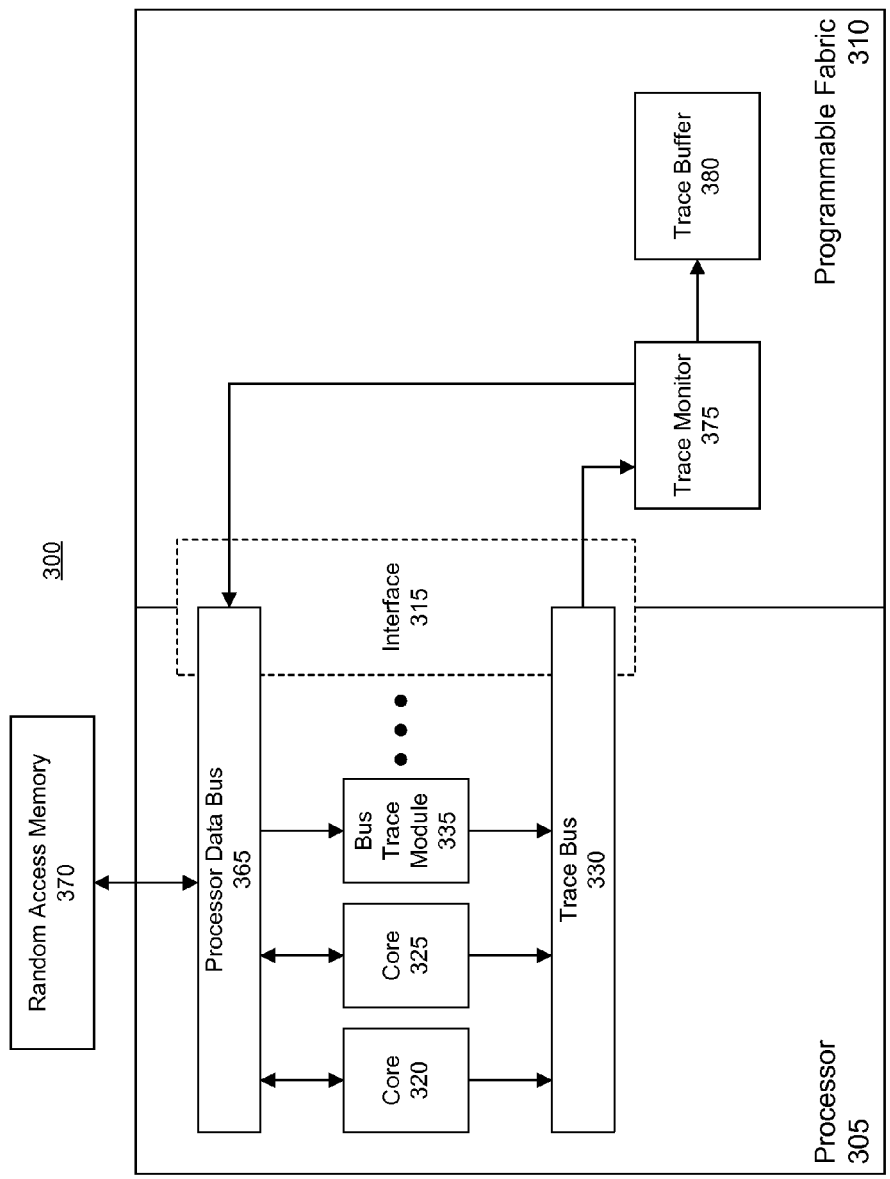
FIG. 4 is a fourth block diagram illustrating an IC configured for integrated debugging in accordance with another embodiment disclosed within this specification.

FIG. 4 is a fourth block diagram illustrating IC 300 of FIG. 3 in accordance with another embodiment disclosed within this specification. As shown, IC 300 includes processor 305 and programmable fabric 310. Processor 305 and programmable fabric 310 can be coupled via interface 315. In the example pictured in FIG. 4, the trace buffer, the trace port, the debug control module, and the fabric signal interface are not shown to more clearly illustrate other aspects of the integrated debugging provided by IC 300. Also, unlike the example pictured in FIG. 3, a processor data bus 365 is shown. As pictured, core 320, core 325, and bus trace module 335 each can be coupled to processor data bus 365 and to trace bus 330.

Within programmable fabric 310, a trace monitor 375 and a trace buffer 380 are implemented. Trace monitor 375 and trace buffer 380 can be implemented as soft IP as described within this specification. As shown, trace monitor 375 can be coupled to trace bus 330 and to processor data bus 365. More particularly, trace monitor 375 can be configured to receive processor trace data from processor 305 via trace bus 330. Trace monitor 375 can perform real time evaluation of the processor trace data.

In an embodiment disclosed herein, trace monitor 375 can output processor trace data to trace buffer 380 for storage or to processor data bus 365. As shown, processor 305 can be coupled to an external random access memory 370. For example, processor 305 can include a memory controller (not shown) that facilitates communication with RAM 370. In any case, processor trace data that is output from trace monitor 375 to processor data bus 365 can be output from IC 300 to RAM 370.

In another embodiment, rather than output processor trace data from trace monitor 375, a modified version of the processor trace data can be output. For example, trace monitor can be configured to perform any of a variety of different real time processing and/or data analysis functions upon received processor trace data. Trace monitor 375 can filter received processor trace data and/or evaluate processor trace data. In one embodiment, trace monitor 375 can be configured to output only a subset of received processor trace data, a modified version of received processor trace data, or a modified and filtered, e.g., subset, of received processor trace data.

In another embodiment, trace monitor 375 can be configured to output processor trace data, or some variation thereof, only responsive to detecting particular parameters within the received processor trace data that indicate the existence of a selected operating state or occurrence of a particular event within processor 305, only responsive to one or more events detected within programmable fabric 310, or responsive to a combination of one or more processor events, one or more fabric events, and/or processor trace information. In the same manner that debugging functions can be initiated, debugging functions also can be turned off. Such is the case with regard to debugging functions initiated within processor 305 and within programmable fabric 310.

It should be appreciated that trace monitor 375 further can be configured to receive fabric trace data from one or more probes (not shown) implemented within programmable fabric 310. The fabric trace data can be merged with the processor trace data and stored within trace buffer 380 or provided to processor data bus 365 for storage in RAM 370. In this example, received processor trace data and fabric trace data can be time stamped according to the internal clocking or timing of programmable fabric 310. Trace monitor 375, for example, can perform the time stamping of trace data. In any case, the processor trace data and the fabric trace data are commingled, e.g., merged, to form combined trace data substantially as described with reference to FIG. 3. In the case of FIG. 4, however, the combined trace data can be stored and/or output from programmable fabric 310 and use clock sources within programmable fabric 310 as references for time stamping.

The example pictured in FIG. 4 allows significantly greater memory resources available within programmable fabric of IC 300 to be used for purposes of debugging. Trace buffer 380, for example, can be implemented to be substantially larger than the trace buffer that is included as part of processor 305. As such, more trace data can be stored. Using real time processing of trace monitor 375 to perform functions such as selectively storing received trace data, e.g., certain portions of processor trace data, filtering unwanted trace data, as well as compressing trace data, the length of time over which processor trace data can be retained and collected can be longer than is otherwise the case using only a trace buffer available within processor 305.

Programmable fabric 310 can be leveraged in additional ways to augment the debugging functionality provided by processor 305. In another embodiment, an Ethernet port can be implemented within programmable fabric 310. Accordingly, processor trace data, fabric trace data, or both in the form of merged trace data, can be output from the Ethernet port. Using the Ethernet port allows for remote debugging of trace data.

In another embodiment, processor 305 can be configured to output trace information as part of a normal operation mode as opposed to being actively placed into a debug mode. Accordingly, trace monitor 375 can be configured to monitor operation of processor 305. Responsive to detecting the occurrence of a selected event, e.g., as indicated by received processor trace data, trace monitor 375 can instruct processor 305 to enter a safe or recovery mode. In that case, processor 305 can discontinue current operation and immediately enter a safe mode or a recovery mode in which, for example, only trusted code is executed by processor 305, the state of processor 305 is restored to a predetermined and known state, and/or processor 305 continues operation with limited functionality. Trace monitor 375 can send an instruction initiating the safe mode by sending a signal through interface 315. Such a signal can be provided directly, through trace bus 330, or through processor data bus 365.

Figure 5:
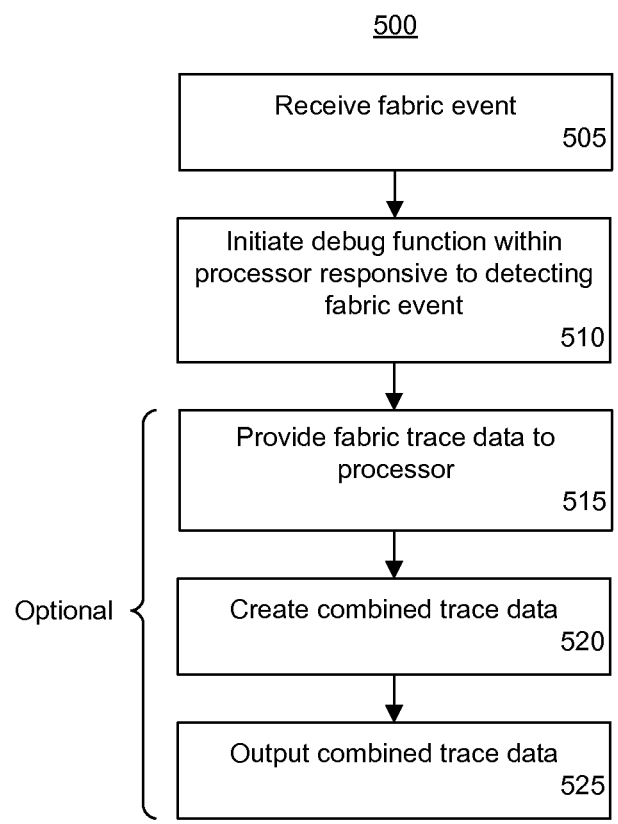
FIG. 5 is a first flow chart illustrating a method of integrated debugging in accordance with another embodiment disclosed within this specification.

FIG. 5 is a first flow chart illustrating a method 500 of integrated debugging in accordance with another embodiment disclosed within this specification. Method 500 can be implemented by an IC as described within this specification. Accordingly, method 500 can begin in step 505 where a fabric event is received. The fabric event can be received, for example, by a circuit block within the programmable fabric or within the interface between the processor and the programmable fabric.

In step 510, responsive to detecting the fabric event, a debug function can be initiated within the processor. For example, the debug function can be initiated by the circuit block within the programmable fabric or by the interface. In an embodiment disclosed herein, the debug function that can be initiated can be one that the starts the generation and/or storage of processor trace data.

Steps 515-525 can be optional steps. In step 515, for example, fabric trace data can be provided to the processor, e.g., to a debug system within the processor. In step 520, combined trace data can be created. For example, the debug system can create combined trace data. The debug system within the processor can merge the fabric trace data with processor trace data that is being generated in consequence of initiation of the debug function by the programmable fabric.

In step 525, the combined trace data can be output. As used herein, "outputting" and/or "output" can mean, for example, storing in memory, e.g., a trace buffer of the processor, sending or transmitting to another system external to the IC, or the like.

It should be appreciated that since steps 515-525 are optional in nature, the processor trace data that is generated can be output independently of any fabric trace data. Moreover, the processor trace data can be provided to the programmable fabric, e.g., a trace analysis module and/or a trace buffer within the programmable fabric, for further processing and/or storage.

Figure 6:
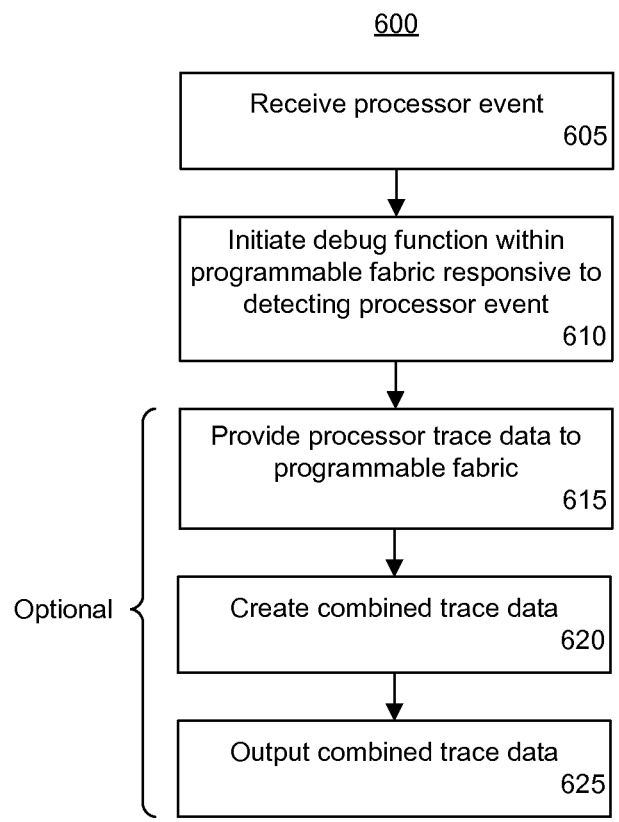
FIG. 6 is a second flow chart illustrating a method of integrated debugging in accordance with another embodiment disclosed within this specification.

FIG. 6 is a second flow chart illustrating a method 600 of integrated debugging in accordance with another embodiment disclosed within this specification. Method 600 can be implemented by an IC as described within this specification. Accordingly, method 600 can begin in step 605 where a processor event is received by either the interface between the processor and the programmable fabric or a debug system within the processor.

In step 610, responsive to detecting the processor event, a debug function can be initiated within the programmable fabric. For example, the debug function can be initiated by the debug system of the processor or by the interface. In an embodiment disclosed herein, the debug function that can be initiated can be one that starts the generation and/or storage of fabric trace data.

Steps 615-625 can be optional steps. In step 615, for example, processor trace data can be provided to the programmable fabric, e.g., to a trace monitor, a trace buffer, or the like, within the programmable fabric. In step 620, combined trace data can be created. For example, the particular circuit block within the programmable fabric that receives processor trace data can also receive fabric trace data and create combined trace data. The circuit block can merge the processor trace data with the fabric trace data being generated in consequence of initiation of the debug function by the processor. In step 625, the combined trace data can be output. For example, the combined trace data can be sent to a destination external to the IC, can be stored within a trace buffer within the programmable fabric, or the like.

It should be appreciated that since steps 615-625 are optional in nature, the fabric trace data that is generated can be output independently of any processor trace data. Moreover, the fabric trace data can be provided to the processor, e.g., a debugging system and/or a trace buffer within the processor, for further processing and/or storage.

The flowcharts in the figures illustrate the architecture, functionality, and operation of possible implementations of systems, methods and computer program products according to one or more embodiments disclosed within this specification. In this regard, each block in the flowcharts may represent a module, segment, or portion of code, which comprises one or more portions of executable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and executable instructions.

One or more embodiments can be realized in hardware or a combination of hardware and software. One or more embodiments can be realized in a centralized fashion in one system or in a distributed fashion where different elements are spread across several interconnected systems. Any kind of data processing system or other apparatus adapted for carrying out at least a portion of the methods described herein is suited.

One or more embodiments further can be embedded in a device such as a computer program product, which comprises all the features enabling the implementation of the methods described herein. The device can include a non-transitory data storage medium, e.g., a computer-usable or computer-readable medium, storing program code that, when loaded and executed in a system comprising memory and a processor, causes the system to perform at least a portion of the functions described within this specification. Examples of data storage media can include, but are not limited to, optical media, magnetic media, magneto-optical media, computer memory such as random access memory or hard disk(s), or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system. Program code also can include programmatic representations of a circuit, e.g., configuration data, netlists, bitstreams, hardware description language files, or the like that can be used to implement or specify physical circuitry.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. A method of debugging within an integrated circuit (IC) comprising an embedded processor, the method comprising:
   detecting an event within a circuit of the IC that is external to the processor;
   wherein the circuit is implemented within a programmable circuitry portion of the IC coupled to the processor;
   wherein the programmable circuitry portion is configurable to implement different physical circuits;
   responsive to detecting the event, initiating a debug function within the processor;
   selecting the debug function to include generating processor trace data originating in the processor;
   receiving, within the circuit, the processor trace data;
   detecting, within the circuit, an operating state of the processor from the processor trace data; and
   outputting, from the circuit, at least a portion of the processor trace data responsive to detecting the operating state.

2. The method of claim 1, further comprising:
   responsive to detecting a trigger from the processor, generating fabric trace data originating in the circuit within the programmable circuitry portion of the IC; and
   providing the fabric trace data to the processor.

3. The method of claim 1, wherein outputting, from the circuit, at least a portion of the processor trace data responsive to detecting the operating state further comprises:
   outputting, from the circuit, a subset of the processor trace data from filtering the processor trace data within the circuit.

4. The method of claim 1, further comprising:
   generating fabric trace data originating from the circuit within the programmable circuitry portion of the IC;
   providing the fabric trace data to a trace port of the processor over a trace bus in the processor; and
   outputting the fabric trace data from the trace port to a memory external to the IC.

5. The method of claim 1, further comprising:
   detecting, within the circuit, a selected event in the processor trace data; and responsive to detecting the event, the circuit instructing the processor to enter a safe mode.

6. A method of debugging within an integrated circuit (IC) comprising an embedded processor, the method comprising:
detecting an event within the processor;
responsive to detecting the event, initiating a debug function within a circuit block of the IC that is external to the processor;
wherein the circuit block is implemented within a programmable circuitry portion of the IC coupled to the processor;
wherein the programmable circuitry portion is configurable to implement different physical circuits; and
selecting the debug function to include generating fabric trace data originating in the circuit block.

7. The method of claim 6, further comprising:
generating processor trace data originating in the processor;
providing the processor trace data to the circuit block; and
outputting, from the circuit block, a subset of the processor trace data from filtering the processor trace data within the circuit block.

8. The method of claim 7, further comprising:
creating combined trace data by merging the processor trace data with the fabric trace data; and
storing the combined trace data within a trace buffer with the programmable circuitry.

9. The method of claim 7, further comprising:
generating the processor trace data responsive to a trigger originating from a source within the IC that is external to the processor and within the programmable circuitry.

10. The method of claim 8, further comprising:
detecting, within the circuit block, an operating state of the processor from the processor trace data; and
outputting, from the circuit block, at least a portion of the processor trace data responsive to detecting the operating state.

11. The method of claim 8, further comprising:
detecting, within the circuit block, a selected event in the processor trace data; and
responsive to detecting the event, the circuit block instructing the processor to enter a safe mode.

12. An integrated circuit (IC) comprising:
programmable fabric that is configurable to implement different physical circuits;
a processor embedded within the IC;
an interface coupling the programmable fabric with the processor, wherein the interface is configured for cross-triggering of debug functions between the processor and the programmable fabric; and
a trace monitor circuit implemented within the programmable fabric configured to receive processor trace data originating from the processor;
wherein the trace monitor circuit is configured to detect a selected operating state of the processor from the processor trace data; and
wherein the trace monitor circuit outputs the processor trace data responsive to detecting the selected operating state.

13. The IC of claim 12, wherein the interface is further configured to initiate a debug function within the processor responsive to an event originating in the programmable fabric.

14. The IC of claim 12, wherein the interface is further configured to initiate a debug function within the programmable fabric responsive to an event originating in the processor.

15. The IC of claim 12,
wherein the trace monitor circuit is configured to output a subset of the processor trace data from filtering the processor trace data.

16. The IC of claim 12, further comprising:
a circuit block within the programmable fabric configured to detect a selected event in the processor from received processor trace data and, in response to detecting the selected event, instruct the processor to enter a safe mode.

\* \* \* \* \*